United States Patent [19]

Kade

[11] Patent Number: 5,136,238
[45] Date of Patent: Aug. 4, 1992

[54] TEST FIXTURE WITH DIAPHRAGM BOARD WITH ONE OR MORE INTERNAL GROUNDED LAYERS

[75] Inventor: James H. Kade, Plainville, Mass.

[73] Assignee: Electro-Fix, Inc., Plainville, Mass.

[21] Appl. No.: 617,691

[22] Filed: Nov. 26, 1990

[51] Int. Cl.⁵ .................. G01R 31/02; H05K 7/18
[52] U.S. Cl. ...................... 324/158 F; 324/158 P; 361/212
[58] Field of Search ............ 324/158 F, 158 P, 72.5, 324/158 R; 439/482, 68, 69, 70; 361/220, 212

[56] References Cited

U.S. PATENT DOCUMENTS

| | | |
|---|---|---|
| 4,352,061 | 9/1982 | Matrone .................. 324/158 F |
| 4,544,886 | 10/1985 | Murray et al. ............ 324/158 F |
| 4,642,727 | 2/1987 | Dalal ...................... 361/220 |
| 4,812,754 | 3/1984 | Tracey et al. ............ 324/158 P |
| 4,814,698 | 3/1989 | St. Onge et al. .......... 324/158 F |
| 4,870,354 | 9/1989 | Davaut ................... 324/158 F |

*Primary Examiner*—Vinh Nguyen
*Attorney, Agent, or Firm*—Jerry Cohen; Edwin H. Paul

[57] ABSTRACT

Electrical circuit test fixture with a multi-layer insulating diaphragm board (26) with one or more internal conductive layers (28) within the board, the fixture operating free of static discharge.

9 Claims, 1 Drawing Sheet

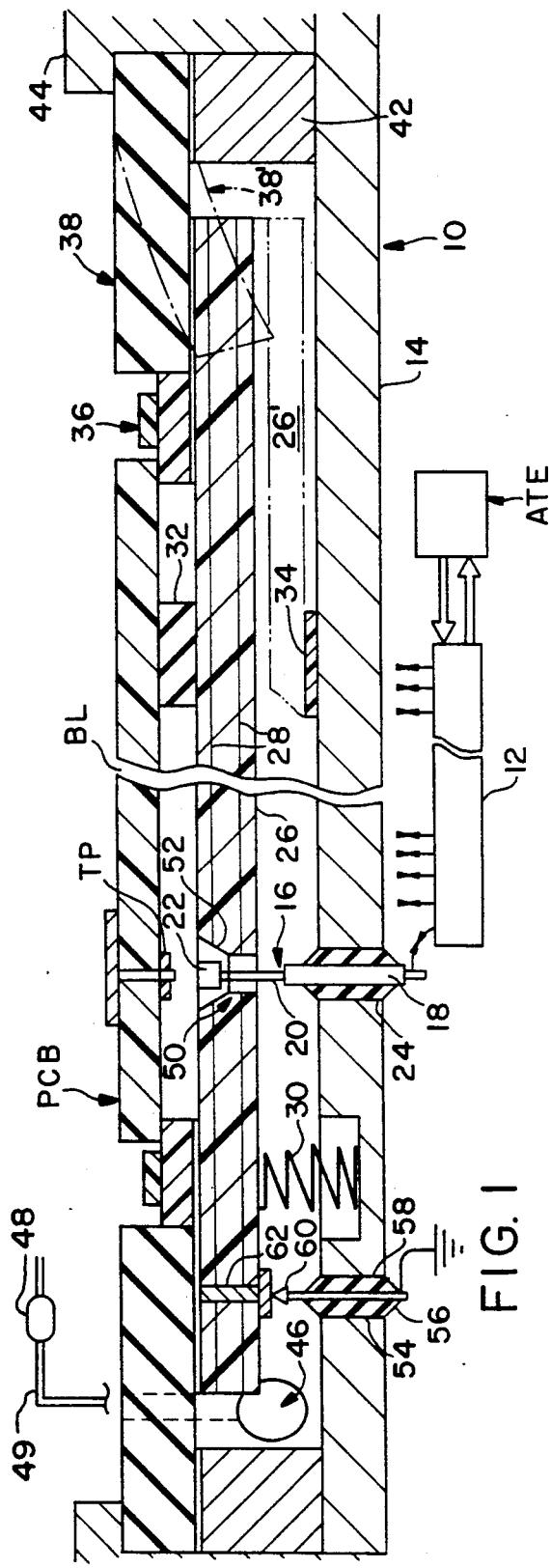
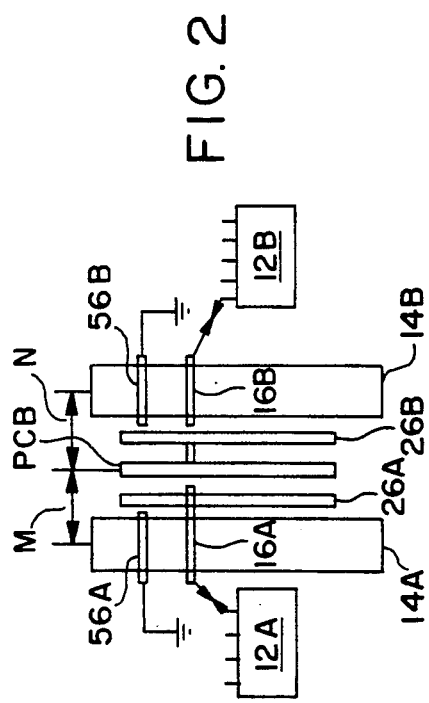
FIG. 1
FIG. 2

TEST FIXTURE WITH DIAPHRAGM BOARD WITH ONE OR MORE INTERNAL GROUNDED LAYERS

FIELD OF THE INVENTION

The present invention relates to electrical circuit testing and more particularly to so-called bed-of-nails type testing systems for circuit boards and comprising a multitude of circuit test points. The present invention deals with enhancing the protection of such systems from static discharges.

BACKGROUND OF THE INVENTION

A common form of such test system has a non-conducting probe board with multitudes of probe assemblies passing through a probe board. Each such probe assembly has a contact probe mounted in a receptacle. A diaphragm board is provided over the probe board with holes for accommodating the probe assemblies. The board is usually non-conductive and the holes are about ⅛" diameter so that hole edges rarely, if ever, contact probe pins or receptacle passing therethrough. A diaphragm board is suspended over the probe board on coil springs and/or other resilient supports. A circuit board to be tested is laid on the diaphragm board within a gasket seal and on supports to form a roof of an enclosed space comprising the circuit board, the edge seal, a side wall or rail of the instrument extending from and above the probe board, further sealing artifacts (such as a picture frame type of rectangular seal gasketing) and the probe board. The diaphragm board is inside that volume. An externam vacuum pump and line are connected thereto by a port in the wall. Pulling a vacuum in the volume causes a lowering of the circuit board as ambient air pressure above it presses down and firm contact between bottom face contact points of the printed circuits and component mounting positions and the probe contacts.

There is a concern in some segments of the electronics production industry that static can build up on the test fixtures at the volume and this can lead to static discharges and/or surface leakage currents, particularly under conditions of cold or dryness in the test region, where fast air flow occur due to cyclic vacuum/air release (after test) and/or where sprays or air jets for cleaning or other purposes are applied during test setup. The static can occur at any or all surfaces of the said volume. The static or other voltage source can also be on an external item, e.g. the circuit board under test or any object that the test technician holds near the fixture and lead to a sparking to or from a grounded part of the volume of such external object.

The literature and practice of the field include recognition of these problem areas and a number of cures including laminated constructions of test fixture parts to include conductive layers at the surfaces of such parts and/or conductive coating of such surfaces, such layers or coatings being connected to ground.

It is the object of the patent invention to improve the static discharge and leakage protection in testing fixtures of the type described and in other test environments.

SUMMARY OF THE INVENTION

The invention comprises a construction test equipment of the class described in which a modified diaphragm board is utilized. The modified board comprises one or two inserted conductive layers just below one or both of the flat opposite faces of the board. The boards per se range from 0.1 to 1.0 inches thick in practice. The buried conductive layers are provided at a 0.005" to 0.0025" depth, under a dielectric covering.

The board can be so fabricated in one of several ways.

(a) Preferrably the board comprises multi-layers of glass-reinforced epoxy sheets of 0.005"–0.010" thickness. These layers when laminated, form various total thicknesses as required, i.e. fifty 0.008 thick layers will form a 0.40" thick board. Incorporated within this thickness, close to the working surface, will be an internal layer comprises of metallic foil (copper, aluminum, iron, nickel, alloys, or other conductor) or mesh or other form of conductive layer. The conductive layer can be 1–10 oz. per square foot (about 0.0015–0.015 mils thick).

Alternatively, a conventional nonconductive diaphragm board can be painted or coated or otherwise covered with a conductive layer and then covered with a non-conductive layer.

In either such case a conductive lateral member, e.g. a stud or bolt passes through the modified board. A probe-assembly is provided passing through the probe board and having a spring loaded pin bearing against an end of the bolt or stud end. That probe assembly is grounded. Edge contact of the conductive layer(s) in the modified board at a hole therein with the bolt provides the grounding connection therebetween.

It has been discovered that this modification of probe board and diaphragm board and the added probe assembly therefrom and ground connection eliminates the need for exterior coatings (and coating damage vulnerability) at any other portion of the test fixture. Such coatings are no longer needed on the surfaces of any of the circuit board under test, on the gaskets/seals/side walls, on the probe board or diaphragm board. The test fixture made in accordance with this invention and lacking such surface coating resists efforts to induce a static discharge of leakage current and provides a secure environment of high speed repetitive use of the vacuum test fixture to testing of electrical circuit boards.

Other objects, features, and advantages will be apparent from the following detailed description of preferred embodiments taken in conjunction with the accompanying drawing in which:

BRIEF DESCRIPTION OF THE DRAWING

FIG. 1 is a cross-section of a portion of a test system in a typical test arrangement, made in accordance with a preferred embodiment of the invention; and FIG. 2 is a schematic representation of another arrangement of test system using one or more embodiments of the invention.

DETAILED DESCRIPTION OF PREFERRED EMBODIMENTS

Referring now to FIG. 1, a printed circuit board PCB with many test points TP is placed on a test fixture 10 which is applied to apiece of conventional automated test equipment ATE. An interface assembly comprises wiring connections between the equipment ATE and the fixture 10 and is generally regarded as part of the fixture 10 in commercial understanding. The fixture 10 further comprises a probe board base 14 containing multitudes of probe assemblies 16. Each such assembly has a receptacle 18 electrically connected to the interface 12 and an internal axially movable pin 20 woth spring loading (not shown) within the receptacle. The pin is in continuous electrical contact with the interface via the receptacle and/or other connecting artifacts. Each pin has a splayed out or crown end for contact with a test point TP of the board PCB. Each such probe assembly has a feedthrough construction which comprises an insulating sheath 24 if the board 14 is conductive.

A diaphragm board 26 is provided between the probe board base 14 and board PCB, but not in direct contact with either. The diaphragm board is non-conductive and preferrably comprises a standard layered glass reinforced epoxy board of the type used in making the circuit boards such as PCB, with two conductive sub-surface layers 28 passing through the diaphragm board. The board typically has 20–100 layers of glass reinforced epoxy bonded together each leaving 0.0075" width more or less. Preferably a sub-surface conductive layer takes the place of layer number two or three counting inward from the surface, i.e. to be at a depth of 7.5 or 15 mils from the surface.

An array of dispersed springs (one shown at 30) floats the diaphragm board above the probe board. The diaphragm board has a dispersed array of rubbery or elastomeric (in any event preferably non-conductive and resilient) pads 32 and the probe board base has a dispersed array of pads 34 (preferably phenolic or other hard non-conductive material). A picture frame rubber gasket 38 rests on side rails 42 or the probe board and surrounding structure 44 (which is demountable) secured the gasket to the rail. A vacuum port is connected to external vacuum pump and valving structure via a vacuum line 49. When vacuum is drawn through a port 46 a volume defined by parts PCB, 14, 42 and 38 is partially evacuated. Ambient air pressure on PCB and the top of 38 pushes PCB and 38 inwardly on the volume, pushing diaphragm board down to a position indicated at 28 (chain line partial view to the right of break lines BL) with gasket 38 fusing to the position indicated at 38. The circuit board then seats on the top of the layered board 26 via prods 32 and test points TP are firmly in contact with ends 22 of pins 20 which are lowered against their springs in tubes 18.

The board 26 has holes 50 accommodating with free clearance the probe assemblies 16 each such hole including—if necessary —an expansion to clear end 22, such as a counter-sink 52.

A further probe assembly 56 is provided in the probe board base comprising a tube 58, pin 60 and feed through 54. Assembly 56 is connected to ground. A conductive bolt 62 passes transversely through board 26 (being press fit into a hole in the board), the bolt contacting layers 28 to complete the grounding path for such layers.

It will be understood that the horizontal arrangement of FIG. 1 can be applied in an upside down configuration or vertical arrangement, that the vacuum means for drawing the board PCB into hard contact with pins can be replaced by well known linkage/cam arrangements and that other variants well known in the art can be made consistent with the invention disclosed herewith.

For example FIG. 2 shows another test arrangement with two interface systems 12A, 12B, two probe boards 14A, 14B with probe assemblies 16A, 16B and diaphragm boards 26A, 26B for testing a circuit board PCB on the two sides in the same or quick-sequence tests cycles. Relative movements M, N between PCB and the probe boards can be effected by enhancing or vacuum means with adjustment to the FIG. 1 arrangement well known to those skilled in the art.

It is also within the scope of the invention to utilize only one-sub-surface conductive layer in the diaphragm board(s) 26 preferably at the side thereof facing PCB.

It will now be apparent to those skilled in the art that other embodiments, improvements, details, and uses can be made consistent with the letter and spirit of the foregoing disclosure and within the scope of this patent, which is limited only the following claims, construed in accordance with the patent law, including the doctrine of equivalents.

What is claimed is:

1. In an electrical test system for testing circuit boards comprising a non-conducting probe board with upper and lower extended flat surfaces, multiple feed through holes therein, conductive probe means passing through the holes, a vacuum environment chamber defined as the volume formed between the board under test and the probe board, means for vacuum drawing and release in each test cycle.

2. System in accordance with claim 1 wherein the conductive layer is within 0.01 inches of the surface layer in said region.

3. System in accordance with claim 1 wherein the holes in such region are expanded to avoid probe means, conductive layer contact.

4. The system of claim 3 wherein the expansions are countersinks.

5. System in accordance with claim 1 wherein the said region is substantially the entirety of one of said flat surfaces.

6. System in accordance with claim 5 wherein the said region is substantially the entirety of both flat surfaces.

7. System in accordance with claim 1 wherein the probe means for testing comprises assemblies, each being a pin within a tube, (of the diaphragm board) extended from the probe board through holes in the diaphragm board and towards test points of the circuit board, each said pin being spring loaded within said tube, and further comprising a conductive lateral member passing through the diaphragm board and contacting each conductive layer therein and extending to a bottom face of the diaphragm board, and a further pin within a tube probe assembly, that extends to and contacts a lower end of the conductive lateral member, said further probe assembly being grounded.

8. An electrical test system for circuit boards comprising, in combination:
   (a) means defining at least one bed of nails test probe array with a base and test probes extending therefrom:
   (b) means for supporting a board to be tested in opposing escalation to each test probe array;
   (c) means for relatively moving the board and array towards each other for engagement and disengagement of the test points on the board with probe ends, said region between said board and said array defining planar regions;
   (d) means for draining to ground static charge from at least one said planar region between the test probe array base and circuit board under test without grounding circuitry or electrical test points of the circuit board or the probes and essentially without any direct physical contact with the base, probes or circuit board.

9. System in accordance with claim 8 wherein each means for draining to ground comprises a diaphragm board with holes for clear passage of probes, dispersing means for floating the diaphragm board between its surrounding circuit board and probe array base, the diaphragm board being non-conductive except for at least one conductive sub-surface layer thereof close to but not at its surface, and conductive member means for connecting each such conductive layer to ground.

* * * * *